(12) United States Patent
Yanagawa et al.

(10) Patent No.: US 9,117,778 B2
(45) Date of Patent: Aug. 25, 2015

(54) DISPLAY DEVICE

(75) Inventors: Hiroto Yanagawa, Osaka (JP); Katsuhiko Kumagawa, Osaka (JP)

(73) Assignee: Joled Inc., Tokyo (JP)

( * ) Notice: Subject to any disclaimer, the term of this patent is extended or adjusted under 35 U.S.C. 154(b) by 53 days.

(21) Appl. No.: 14/130,945

(22) PCT Filed: Jul. 18, 2012

(86) PCT No.: PCT/JP2012/004580
§ 371 (c)(1),
(2), (4) Date: Jan. 6, 2014

(87) PCT Pub. No.: WO2013/014883
PCT Pub. Date: Jan. 31, 2013

(65) Prior Publication Data
US 2014/0139761 A1    May 22, 2014

(30) Foreign Application Priority Data
Jul. 25, 2011   (JP) ................... 2011-162578

(51) Int. Cl.
*H01L 27/32* (2006.01)
*G06F 3/044* (2006.01)
(Continued)

(52) U.S. Cl.
CPC .............. *H01L 27/323* (2013.01); *G06F 3/044* (2013.01); *G06F 3/0412* (2013.01); *G02F 1/13338* (2013.01); *G06F 2203/04103* (2013.01)

(58) Field of Classification Search
CPC ....... G06F 3/044; G06F 3/0412; G06F 3/041; G06F 3/047; G06F 2203/04111; G06F 2203/04103; G06F 2203/04107; G06F 2203/04112; G02F 1/13338; G02F 1/133512; G02F 1/133514; G02F 1/133509; G02F 1/1343; G02F 1/136209; G02F 1/136286; G02F 2201/44; B32B 2547/202; B32B 2457/208

USPC .......... 345/173, 92, 76; 349/12, 106, 139, 43, 349/69; 315/169.3; 200/600
See application file for complete search history.

(56) References Cited

U.S. PATENT DOCUMENTS 6,501,529 B1   12/2002   Kurihara et al.
7,482,208 B2   1/2009    Kim et al.
(Continued)

FOREIGN PATENT DOCUMENTS

JP   2001-75074    3/2001
JP   2005-293074   10/2005
(Continued)

OTHER PUBLICATIONS

International Search Report issued Sep. 25, 2012 in International (PCT) Application No. PCT/JP2012/004580.

*Primary Examiner* — Thoi Duong
(74) *Attorney, Agent, or Firm* — Wenderoth, Lind & Ponack, L.L.P.

(57) ABSTRACT

A display device includes: a display panel including a plurality of pixels arranged in rows and columns; and a touch panel opposed to the display panel, wherein the display panel includes a non-display portion which is a region between neighboring pixels, the touch panel includes: a plurality of first electrode patterns which are formed along a first direction which is one of a row direction and a column direction of the pixels; and a plurality of second electrode patterns which are formed along a second direction which is the other one of the directions, at least a part of the first electrode patterns and at least a part of the second electrode patterns being metal, and the metal parts of the first electrode patterns and the second electrode patterns are present within the non-display portion of the display panel in plan view.

12 Claims, 9 Drawing Sheets

(51) Int. Cl.
    *G06F 3/041* (2006.01)
    *G02F 1/1333* (2006.01)

(56) References Cited

U.S. PATENT DOCUMENTS

| | | | |
|---|---|---|---|
| 8,094,096 | B2 | 1/2012 | Okumoto |
| 8,289,242 | B2 | 10/2012 | Okumoto |
| 2007/0065991 | A1 | 3/2007 | Kim et al. |
| 2008/0211394 | A1* | 9/2008 | Koshihara et al. ............ 313/504 |
| 2010/0302221 | A1 | 12/2010 | Okumoto |
| 2011/0037716 | A1 | 2/2011 | Lee et al. |
| 2012/0074397 | A1 | 3/2012 | Okumoto |

FOREIGN PATENT DOCUMENTS

| | | |
|---|---|---|
| JP | 2006-163619 | 6/2006 |
| JP | 2007-506139 | 3/2007 |
| JP | 2009-259063 | 11/2009 |
| JP | 2011-040042 | 2/2011 |
| JP | 2011-150115 | 8/2011 |
| JP | 2012-018938 | 1/2012 |
| JP | 4894769 | 3/2012 |
| WO | 2005/027187 | 3/2005 |

* cited by examiner

DISPLAY DEVICE

TECHNICAL FIELD

The present invention relates to display devices and particularly to a display device including a detection device (touch panel) which detects, when a user's finger or pen touches or approaches a detection surface (touch surface), a position of the finger or pen.

BACKGROUND ART

In a display device, in order to allow a user to perform operation such as input easily while looking at the screen, so-called a touch panel has been widely used.

A touch panel is usually attached on one main surface side (display surface side) of a display panel. The user selects an object such as a button displayed on the screen of the display panel through the touch panel, to perform various operations including input on the display panel.

For example, Patent Literature (PTL) 1 discloses a display device in which a touch panel is integrally provided on the front surface of the display panel.

CITATION LIST

Patent Literature

[PTL 1] Japanese Unexamined Patent Application Publication No. 2006-163619

SUMMARY OF INVENTION

Technical Problem

Recently, along with the increase in screen size and improvement in definition of display panels such as the liquid crystal displays, plasma displays, organic EL displays, and so on, touch panels used in combination with such display panels are also getting larger and supporting higher definition.

The present invention has been conceived in view of the above situation, and has an object to provide a display device including a touch panel with a relatively large inch size, high definition, and good visibility.

Solution to Problem

In order to achieve the above-described object, a display device according to an aspect of the present invention includes: a display panel including a plurality of pixels arranged in rows and columns; and a touch panel opposed to the display panel, wherein the display panel includes a non-display portion which is a region between neighboring pixels, the touch panel includes: a plurality of first electrode patterns which are formed along a first direction which is one of a row direction of the pixels and a column direction of the pixels; and a plurality of second electrode patterns which are formed along a second direction which is the other one of the row direction of the pixels and the column direction of the pixels, at least a part of the first electrode patterns and at least a part of the second electrode patterns being metal, and the metal part of the first electrode patterns and the metal part of the second electrode patterns are present within the non-display portion of the display panel in plan view.

Advantageous Effects of Invention

With the present invention, a display device can be provided which includes a touch panel with a relatively large inch size, high definition, and good visibility.

DESCRIPTION OF EMBODIMENTS

Embodiment 1

Figure 1A:
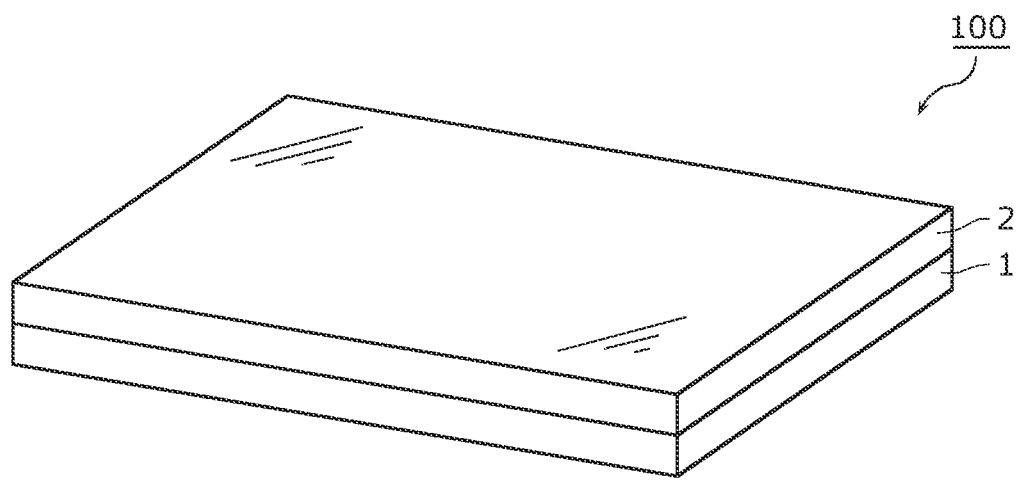
FIG. 1A is a perspective view showing a schematic configuration of a display device according to an embodiment of the present invention.

(Background Leading to an Aspect of the Present Invention)

Recently, display panels have been larger in screen size and have supported higher definition. Along with this, touch panels used in combination with these display panels are also required to have larger screens and support higher definition.

However, since a high-resistance transparent electrode material such as indium Tin Oxide (ITO) is used as the electrode patterns for detecting a position of a finger or pen on the touch panel, there is a problem in that the wire resistance increases and the sensitivity in detection of the touch position lowers when increasing the screen size and definition of the touch panel and making the wire of the electrode patterns longer or narrower.

In addition, when a metal which is a low-resistance material such as aluminum or copper is used for the electrode patterns of the touch panel for the purpose of reducing the wire resistance, there is a problem in that light of the image displayed on the display panel is blocked by the metal, which lowers the visibility of the image in some cases.

In order to solve the problem, a display device according to an aspect of the present invention includes: a display panel including a plurality of pixels arranged in rows and columns; and a touch panel opposed to the display panel, wherein the display panel includes a non-display portion which is a region between neighboring pixels, the touch panel includes: a plurality of first electrode patterns which are formed along a first direction which is one of a row direction of the pixels and a column direction of the pixels; and a plurality of second electrode patterns which are formed along a second direction which is the other one of the row direction of the pixels and the column direction of the pixels, at least a part of the first electrode patterns and at least a part of the second electrode patterns being metal, and the metal part of the first electrode patterns and the metal part of the second electrode patterns are present within the non-display portion of the display panel in plan view.

With this aspect, since the first electrode patterns and the second electrode patterns of the touch panel comprise a metal which is a low-resistance material, the wire resistance of the first electrode patterns and the second electrode patterns can be reduced as compared with the case where the first electrode patterns and the second electrode patterns comprise only a transparent electrode material which is a high-resistance material. With this, the touch panel with larger screen and higher definition can be realized with ease. Furthermore, the presence of the metal parts of the first electrode patterns and the second electrode patterns within the non-display portion of the display panel makes it possible to suppress blocking of light of the images on the display panel caused by the metal parts of the first electrode patterns and the second electrode patterns. With this, it is possible to suppress degradation of image visibility. Furthermore, the use of metal for the first electrode patterns and the second electrode patterns improves reliability against bending stress.

Furthermore, in the display device according to an aspect of the present invention, each of the pixels may include a plurality of sub-pixels which are arranged along the first direction and have different colors, each of the sub-pixels may include: an upper electrode, a lower electrode, and an organic light-emitting layer formed between the upper electrode and the lower electrode and corresponding to the pixel, the display panel may include: a bank which defines the organic light-emitting layer and is formed corresponding to the non-display portion; and an auxiliary wire covered with the bank and electrically connected to the upper electrode, and at least one of (i) the first electrode patterns and (ii) the second electrode patterns is arranged above the auxiliary wire.

With this aspect, at least one of (i) the first electrode patterns and (ii) the second electrode patterns on the touch panel is arranged above the auxiliary wire covered with the bank (non-display portion) of the display panel. Specifically, the first electrode patterns or the second electrode patterns are formed using a region, in which the auxiliary wire is formed, in the display panel. With this, as long as the display panel has the auxiliary wire, the first electrode patterns or the second electrode patterns comprising metal can be arranged easily without making specific changes in the design of the display panel and without degradation of the image visibility.

Furthermore, in the display device according to an aspect of the present invention, each of the first electrode patterns may be arranged between the sub-pixels neighboring in the second direction, and the auxiliary wire and each of the second electrode patterns may be arranged between the pixels neighboring in the first direction.

With this aspect, the first electrode patterns are arranged for each of the sub-pixels in the second direction (column direction for example), and the auxiliary wires and the second electrode patterns are arranged for each of the pixels in the first direction (row direction for example). With this, second electrode patterns formed can be utilized for position detection efficiently, without being wasted. Furthermore, by thinning the number of the second electrode patterns, the capacitance detection IC corresponding to the second electrode patterns can be reduced, thereby reducing the costs and the weight of the display device.

Furthermore, in the display device according to an aspect of the present invention, each of the sub-pixels may include a transistor for driving the sub-pixel, and the first electrode patterns may be each arranged to overlap a contact hole for connecting the lower electrode with a source electrode or a drain electrode of the transistor, in plan view.

With this aspect, the first electrode patterns are each arranged to overlap the contact hole for connecting the lower electrode with the source electrode or the drain electrode of the transistor for driving the sub-pixels. With this, the contact hole is formed in a non-light-emitting portion, which can increase the width of the first electrode patterns with ease. Accordingly, even when the first electrode pattern is longer than the second electrode pattern, the first electrode pattern can be made wider with ease, which can equalize the detection sensitivity of the touch panel in the first direction and the second direction.

Furthermore, in the display device according to an aspect of the present invention, each of the first electrode patterns may be a first electrode line which is in a linear shape and has a constant line width, each of the second electrode patterns may be a second electrode line which is in a linear shape and has a constant line width, and a relationship which is W1-W2≤W3-W4 may be satisfied where W1 represents a width between the sub-pixels neighboring in the first direction, W2 represents a width of the first electrode line, W3 represents a width between the sub-pixels neighboring in the second direction, and W4 represents a width of the second electrode line.

With this aspect, even when a misalignment occurs between the display panel and the touch panel, the unbalance in luminance can be suppressed. With this, it is possible to further suppress degradation of image visibility.

Furthermore, in the display device according to an aspect of the present invention, where L1 represents a length of the first electrode line, and L2 represents a length of the second electrode line, a relationship which is W2>W4 may be satisfied when L1>L2, and a relationship which is W2<W4 may be satisfied when L1<L2.

With this aspect, even when the first electrode line and the second electrode line have different lengths, the difference in resistance between the first electrode line and the second electrode line can be reduced. With this, the difference in the detection sensitivity of the touch panel in the first direction and the second direction can be reduced.

Furthermore, in the display device according to an aspect of the present invention, at least one of the first electrode patterns and the second electrode patterns may have a wave-like plan view shape. Alternatively, in the display device according to an aspect of the present invention, both of the first electrode patterns and the second electrode patterns may have wave-like plan view shapes.

With these aspects, even when the line width of the electrode pattern cannot be increased for the purpose of obtaining higher definition, the capacitance which occurs when a finger touches the touch panel can be increased, thereby improving the sensitivity in detection of the capacitance change.

Furthermore, in the display device according to an aspect of the present invention, at least one of the first electrode patterns and the second electrode patterns may include: a plurality of transparent electrode patterns each in a rectangular shape and having corners connected with each other; and a metal line, which is the metal part, layered on the transparent electrode patterns, and the transparent electrode patterns may be formed to extend beyond the metal line. Furthermore, in the display device according to an aspect of the present invention, at least one of the first electrode patterns and the second electrode patterns may include: a plurality of transparent electrode patterns each in a rectangular shape; and a metal line, which is the metal part, for connecting corners of the transparent electrode patterns with each other.

With these aspects, the resistance of the electrode patterns can be lowered without degrading the visibility.

Furthermore, in the display device according to an aspect of the present invention, the display panel may include a light-blocking portion, and the non-display portion may be the light-blocking portion.

With this aspect, the metal part of the first electrode patterns and the second electrode patterns is covered with the light-blocking portion such as a black matrix, which makes it possible to suppress the degradation in the visibility of image on the display panel caused by the metal part of the first electrode patterns and the second electrode patterns.

Furthermore, in the display device according to an aspect of the present invention, each of the first electrode patterns may be a first electrode line which is in a linear shape and has a constant line width, each of the second electrode patterns may be a second electrode line which is in a linear shape and has a constant line width, a line width of the first electrode line may be smaller than a width of the non-display portion in the second direction, and a line width of the second electrode line may be smaller than a width of the non-display portion in the first direction.

With this aspect, the metal part of the first electrode patterns and the second electrode patterns overlaps the non-display portion, which allows covering the metal part of the first electrode patterns and the second electrode patterns by the non-display portion. Therefore, it is possible to suppress the degradation in the visibility of image on the display panel caused by the metal part of the first electrode patterns and the second electrode patterns.

Embodiment

A display device according to an embodiment of the present invention is described with reference to the Drawings. It is to be noted that the embodiment described below shows a preferable specific example of the present invention. Accordingly, the numerical values, shapes, materials, constituent elements, the arrangement and topology of the constituent elements, and so on shown in the following embodiment are mere examples, and thus do not limit the present invention. Therefore, out of the constituent elements in the following embodiment, the constituent elements not stated in the independent claims describing the broadest concept of the present invention are described as optional constituents. It is to be noted that each of the drawings is a schematic view and does not necessarily illustrate the real situation.

First, a configuration of a display device 100 according to the embodiment of the present invention is described with reference to FIG. 1A and FIG. 1B. FIG. 1A is a perspective view, and FIG. 1B is a sectional view, each showing a schematic configuration of the display device 100 according to the embodiment of the present invention, it is to be noted that FIG. 1B shows a state in which a user's finger is touching a touch panel 2.

Figure 1B:
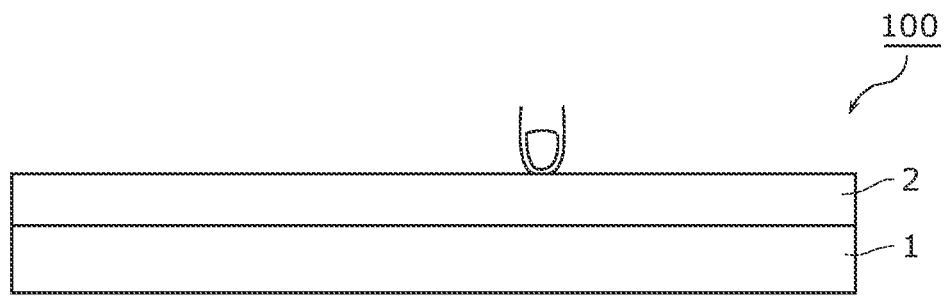
FIG. 1B is a sectional view showing a schematic configuration of a display device according to the embodiment of the present invention.

As shown in FIG. 1A and FIG. 1B, the display device 100 according to the embodiment of the present invention includes: a display panel 1 having a display region (display surface) for displaying information such as images and letters; and a touch panel 2 which is arranged opposed to one main surface side (display surface side) of the display panel 1 and is used for performing various operation including information input on the display panel 1.

An example of the display panel 1 includes: a liquid crystal display (LCD), a plasma display panel (PDP), an organic EL display (OELD), an inorganic EL display.

Furthermore, the touch panel 2 has: position detection function for detecting a position at which the user's finger or touch pen is touching; and input function for inputting the information, such as the detected position information, to the display panel. The touch panel 2 may further have writing input function for writing literal information and so on. It is to be noted that the touch panel 2 allows the user to view the information displayed on the display panel 1, via the touch panel 2.

An example of the touch panel 2 includes a dot spacer touch panel, an electrostatic capacitance touch panel, or a resistive touch panel. Although the touch panel 2 in the present embodiment is the electrostatic capacitance touch panel as an example, this is not an only example.

The display panel 1 and the touch panel 2 are attached, in a relative positional relationship described later, using double-faced adhesive tape called optical clear adhesive (OCA) tape (not shown), for example.

Figure 2A:
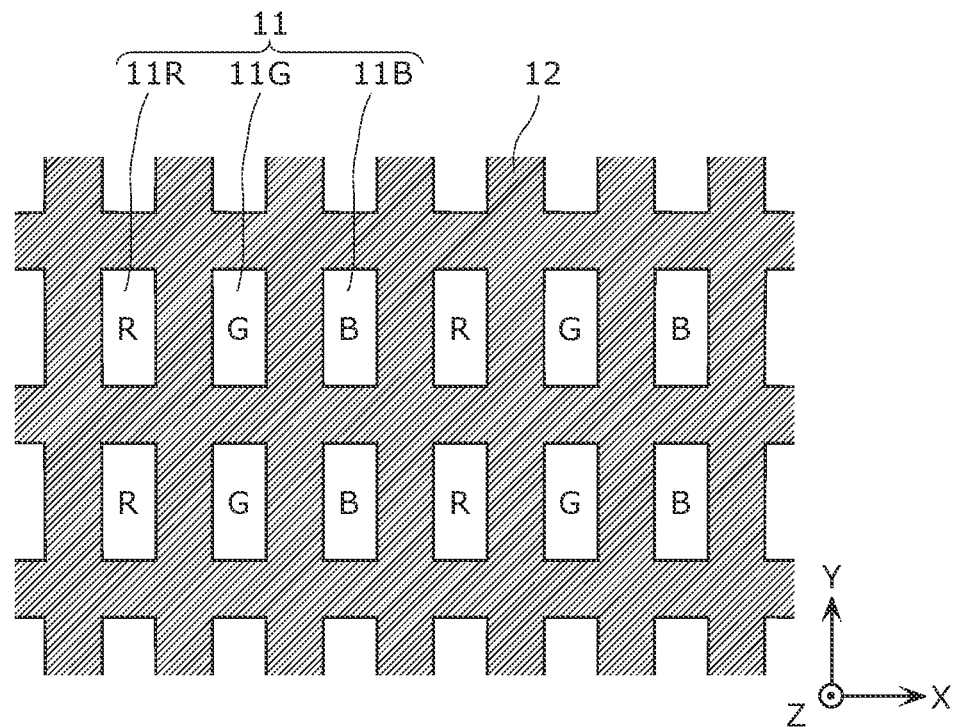
FIG. 2A is a plan view showing a schematic configuration of a display panel in First example of the display device according to the embodiment of the present invention.
Figure 2B:
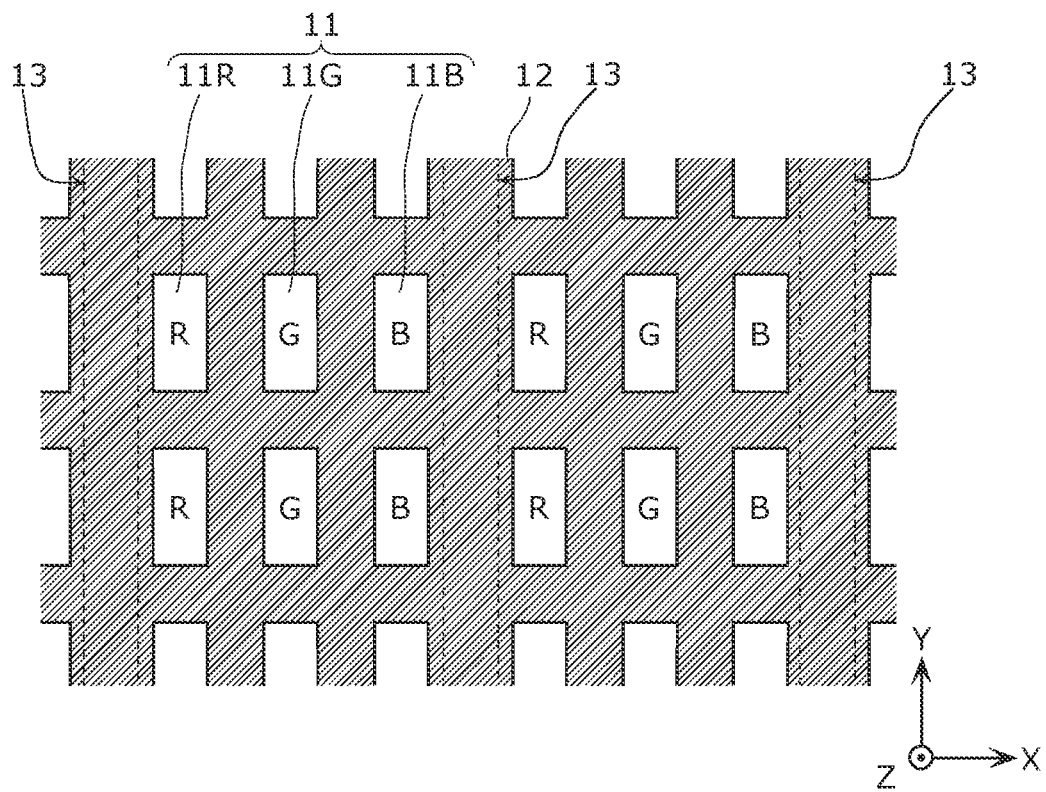
FIG. 2B is a plan view showing a schematic configuration of a display panel in Second example of the display device according to the embodiment of the present invention.

Next, a configuration of the display panel 1 according to the embodiment of the present invention is described with reference to FIG. 2A and FIG. 2B. Each of FIG. 2A and FIG. 2B is a plan view showing a schematic configuration of the display panel 1 of the display device 100 shown in FIG. 1A according to the embodiment of the present invention, and shows an enlarged part of a display region (image display region). It is to be noted that FIG. 2A is First example of the display panel 1 of the display device 100 according to the embodiment of the present invention, and FIG. 2B is Second example of the display panel 1 of the display device 100 according to the embodiment of the present invention.

The display panel 1 includes a display region (image display region) including a plurality of pixels arranged in rows and columns. Each of the pixels includes a plurality of sub-pixels in different colors. Each of the pixels has the same configuration, and the sub-pixels in each pixel are arranged along the row direction of the pixels or the column direction of the pixels. Accordingly, in the display region as a whole, sub-pixels in different colors are arranged repeatedly in a constant pattern along the row or column direction of the pixels (sub-pixels).

As shown in FIG. 2A and FIG. 2B, a single pixel in the display panel 1 of the present embodiment includes three sub-pixels. Specifically, a red pixel 11R corresponding to red (R), a green pixel 11G corresponding to green (G), and a blue pixel 11B corresponding to blue (B) are included. The red pixel 11R, the green pixel 11G, and the blue pixel 11B, are arranged repeatedly along the row direction (X-axis direction) of the pixels. In the column direction (Y-axis direction) of the pixels, sub-pixels of the same color are repeatedly arranged.

Here, when it is assumed that an organic EL display is used as the display panel 1, the organic EL display includes, on a drive circuit layer (planarization layer) including a thin-film transistor formed on a glass substrate: a lower electrode (anode), an upper electrode (cathode), an organic light-emitting layer (light-emitting portion) formed between the upper electrode and the lower electrode, a bank which defines the organic light-emitting layer, a sealing resin layer formed on the upper electrode, and a glass substrate formed on the sealing resin layer. The red pixel 11R, the green pixel 11G, and the blue pixel 11B correspond to the organic light-emitting layers that emit light of the respective colors.

Furthermore, the display region of the display panel 1 has: a pixel portion including a plurality of pixels (sub-pixels); and a non-display portion which is a region between neighboring pixels (sub-pixels). The pixel portion is a portion in which the light, included in the image displayed on the display panel 1, is emitted, and an example of the pixel portion in the organic EL display is the light-emitting region. The non-display portion is a portion other than the display portion of the display region. Specifically, the non-display portion is a portion in which the light, included in the image displayed on the display panel 1, is not emitted, and is a non-light-emitting region in the organic EL display.

As shown in FIG. 2A and FIG. 2B, the pixel portion 11 in the present embodiment includes each of the sub-pixels, namely the red pixel 11R, the green pixel 11G, and the blue pixel 11B. In contrast, the non-display portion 12 is a region between pixels and/or a region between sub-pixels (the red pixel 11R, green pixel 11G, and blue pixel 11B), and includes: a plurality of row-direction patterns in a linear shape extending in the row direction of the pixels; and a plurality of column-direction patterns in a linear shape extending in the column direction of the pixels, as shown in FIG. 2A and FIG. 2B. Specifically, the non-display portion 12 includes a grid-like pattern (grid pattern) in the entire display region.

Here, the non-display portion 12 may be a black matrix (light-blocking portion) formed corresponding to the space between the sub-pixels, for example. An example of the black matrix is a part of a color filter layer formed on the front-surface substrate (substrate on the touch-panel side) of the display panel 1. The color filter layer includes: color filters that is a red color filter, a green color filter, and a blue color filter; and a black matrix formed between the color filters, for example.

Furthermore, another example of the non-display portion 12 may be a bank which defines the organic light-emitting layer in the organic EL display panel. The bank can be formed by a photosensitive material in black for example, and blocks light travelling to the next organic light-emitting layer, to prevent light of neighboring organic light-emitting layers from being mixed.

Furthermore, FIG. 2B shows, as the display panel 1, an organic EL display having an auxiliary wire (bus bar) 13. The auxiliary wire 13 is electrically connected to the upper electrode (common electrode) common to all the sub-pixels, and is formed on the same layer as the lower electrode on the planarization layer, for example. The auxiliary wire 13 has a function for preventing a voltage drop in the upper electrode which occurs in the central region of the display screen.

As shown in FIG. 2B, in the present embodiment, a plurality of the auxiliary wire 13 is formed to extend along the column direction (Y-axis direction) of the pixels. Furthermore, the auxiliary line 13 is formed repeatedly in the row direction of the pixels, not for each sub-pixel but for each pixel. In this case, out of the non-display portion 12 corresponding to the bank, the non-display portion 12 in a portion in which the auxiliary wire 13 is formed (region between pixels) is wider than the non-display portion 12 in a portion in which no auxiliary wire 13 is formed (region between sub-pixels in a pixel). Specifically, the auxiliary wire 13 is formed along the wider non-display portion 12 (bank).

Figure 3A:
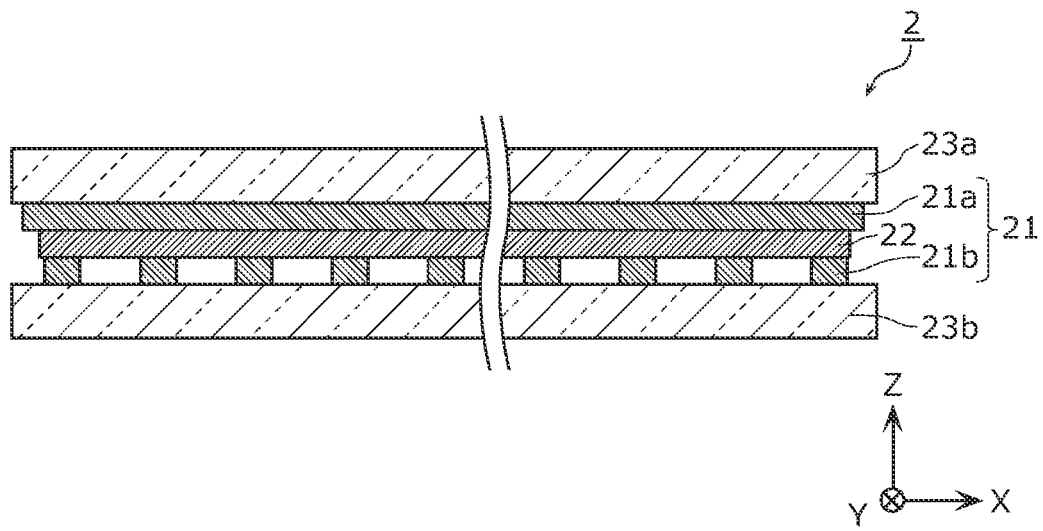
FIG. 3A is a sectional view showing a schematic configuration of a touch panel of the display device according to the embodiment of the present invention.
Figure 3B:
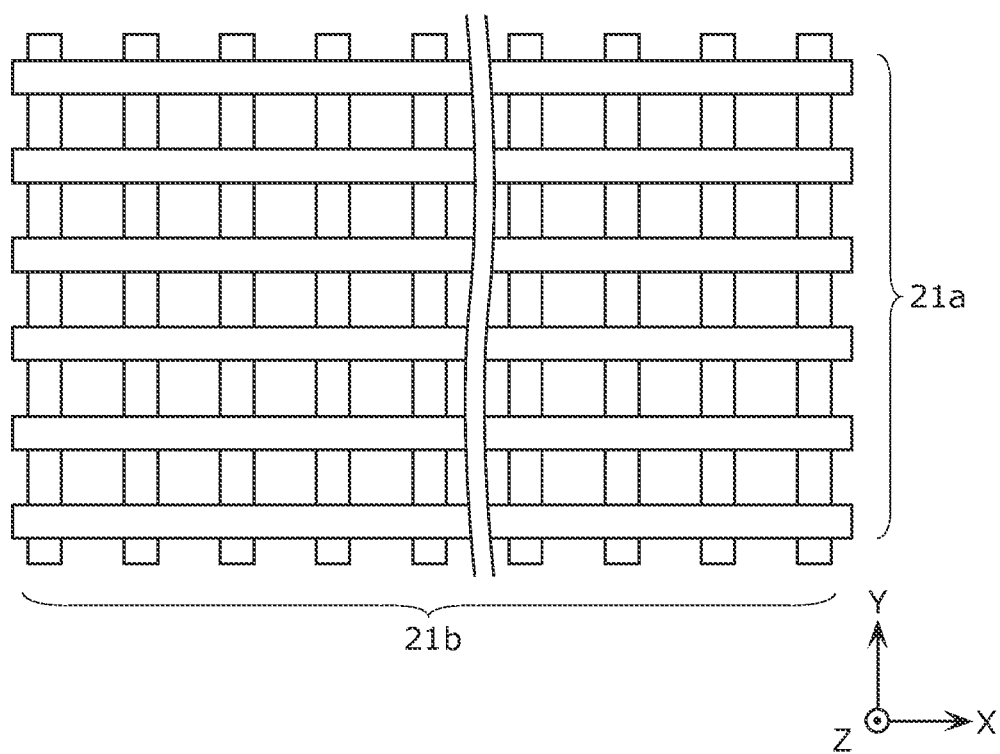
FIG. 3B is a plan view showing a configuration of electrode patterns of the touch panel in FIG. 3A.

Next, description is provided on the touch panel 2 in the present embodiment with reference to FIG. 3A and FIG. 3B. FIG. 3A is a sectional view showing a schematic configuration of the touch panel in the display device according to the embodiment of the present invention, shown in FIG. 1A. FIG. 3B is a plan view showing a configuration of electrode patterns on the touch panel shown in FIG. 3A. FIG. 3A and FIG. 3B show an example of the touch panel 2, which is a projected type electrostatic capacitance capacitive touch panel capable of performing multi-point detection.

As shown in FIG. 3A, the touch panel 2 includes: an electrode pattern 21 including a plurality of first electrode lines 21a and a plurality of second electrode lines 21b; an insulation layer 22 formed between the first electrode lines 21a and the second electrode lines 21b; a first substrate 23a on which the first electrode lines 21a are formed; and a second substrate 23b on which the second electrode lines 21b are formed.

The first electrode lines 21a and the second electrode lines 21b are layered at a distance from each other with the insulation layer 22 provided therebetween, so as not to short-circuit each other. The electrode pattern 21 is formed in a matrix in plan view (when viewed from the user side). In the present embodiment, the first substrate 23a is regarded as the user-side substrate. The insulation layer 22 may comprise a transparent resin, for example. Furthermore, the first substrate 23a and the second substrate 23b each comprises a translucent base material, and it is possible to use a transparent substrate such as a glass substrate or a flexible substrate comprising a flexible transparent resin, for example.

In addition, a predetermined voltage is applied to the electrode pattern 21 (the first electrode lines 21a and the second electrode lines 21b), and when a user's finger approaches or touches the main surface (the outer surface of the first substrate 23a in the present embodiment) of the touch panel 2, the coupling capacitance occurs between the user's finger and the electrode pattern 21, and the touch position at which the user's finger has touched is detected based on a change in electrostatic capacitance between the electrode lines caused by the approach. Specifically, by detecting the change in electrostatic capacitance that occurs between neighboring first electrode lines 21a caused by the finger approaching the touch panel 2, using a capacitance sensor IC (not shown), the touch position of the user's finger in the X-axis direction is detected. Likewise, by detecting the change in electrostatic capacitance that occurs between neighboring second electrode lines 21b caused by the finger approach, using the capacitance sensor IC (not shown), the touch position of the user's finger in the Y-axis direction is detected. As described above, by simultaneously detecting the change in the coupling capacitance in the X-axis direction and the Y-axis direction, the position coordinates of the finger through which the user has touched the touch panel can be detected. It is to be noted that the above-described touch position detection on the touch panel 2 can be performed using a known and public technique according to touch panels.

The first electrode line 21a is an example of the first electrode pattern, and is formed along one of the row direction (X-axis direction) and the column direction (Y-axis direction) of the pixels of the display panel 1. As shown in FIG. 3B, the first electrode line 21a in the present embodiment is a row electrode line provided to extend along the row direction (X-axis direction) of the pixels, and a plurality of the first electrode lines 21a is formed repeatedly in the column direction of the pixels.

The second electrode line 21b is an example of the second electrode pattern, and is formed along the other one of the row direction (X-axis direction) and the column direction (Y-axis direction) of the pixels of the display panel 1. As shown in FIG. 3B, the second electrode line 21b in the present embodiment is a column electrode line provided to extend along the row direction of the pixels, and a plurality of the second electrode lines 21b is formed repeatedly in the row direction of the pixels.

Here, at least a part of each of the first electrode lines 21a and each of the second electrode lines 21b is a metal. It is preferable that a material of the metal part of each of the first electrode lines 21a and each of the second electrode lines 21b is a material having a small resistivity, excellent conductivity, and excellent flexibility. Such a material may be selected from at least one kind of metal out of: copper (Cu), nickel (Ni), aluminum (Al), silver (Ag), and chromium (Cr); and an alloy containing the selected metal, for example.

As described above, using a low-resistance metal for at least a part of the first electrode lines 21a and the second electrode lines 21b makes it possible to lower the resistance of the first electrode lines 21a and the second electrode lines 21b (electrode pattern 21), as compared with the case where the entire wire of the first electrode lines 21a and the second electrodes line 21b comprises a transparent conductive metal oxide, such as ITO, which is a material having relatively high resistance. With this, the accuracy in coordinate position detection as the touch panel can be improved.

In the present embodiment, each of the first electrode lines 21a and each of the second electrode lines 21b is a metal wire in a linear shape having a constant line width, and the entire wire comprises a metal material. With this, the wire resistance of the electrode pattern 21 can be reduced.

Furthermore, the use of metal material for the electrode pattern 21 as in the present embodiment can improve the reliability against bending stress. In other words, in the case where the electrode pattern is formed with ITO and the like, when the touch panel is bent, a problem is likely to be caused including the electrode pattern's breaking or peeling from the substrate. In contrast, forming the electrode pattern 21 with the metal material as in the present embodiment allows preventing the electrode pattern 21 from breaking or peeling from the substrate even when the touch panel is bent. As described above, the electrode pattern 21 in the present embodiment is more reliable against bending stress.

Although the first electrode lines 21a and the second electrode lines 21b are sandwiched by the two transparent substrates (the first substrate 23a and the second substrate 23b) opposed to each other in the touch panel 2 in the present embodiment, this is not an only example. For example, a transparent conductive film covering the entire first electrode lines 21a and the second electrode lines 21b in an insulated state with a transparent resin material may be used as the touch panel 2.

Next, the relative positional relationship between the display panel 1 and the touch panel 2 of the display device 100 according to the embodiment of the present invention is described with reference to FIG. 4A and FIG. 4B.

Figure 4A:
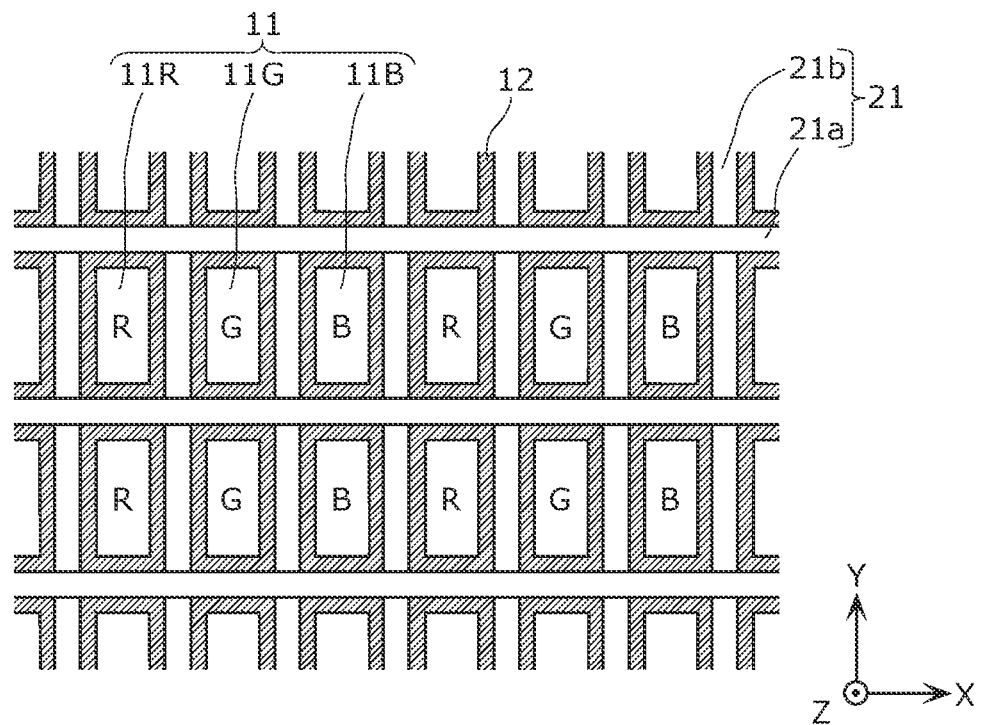
FIG. 4A is a plan view showing a schematic configuration of the display device according to the embodiment of the present invention.
Figure 4B:
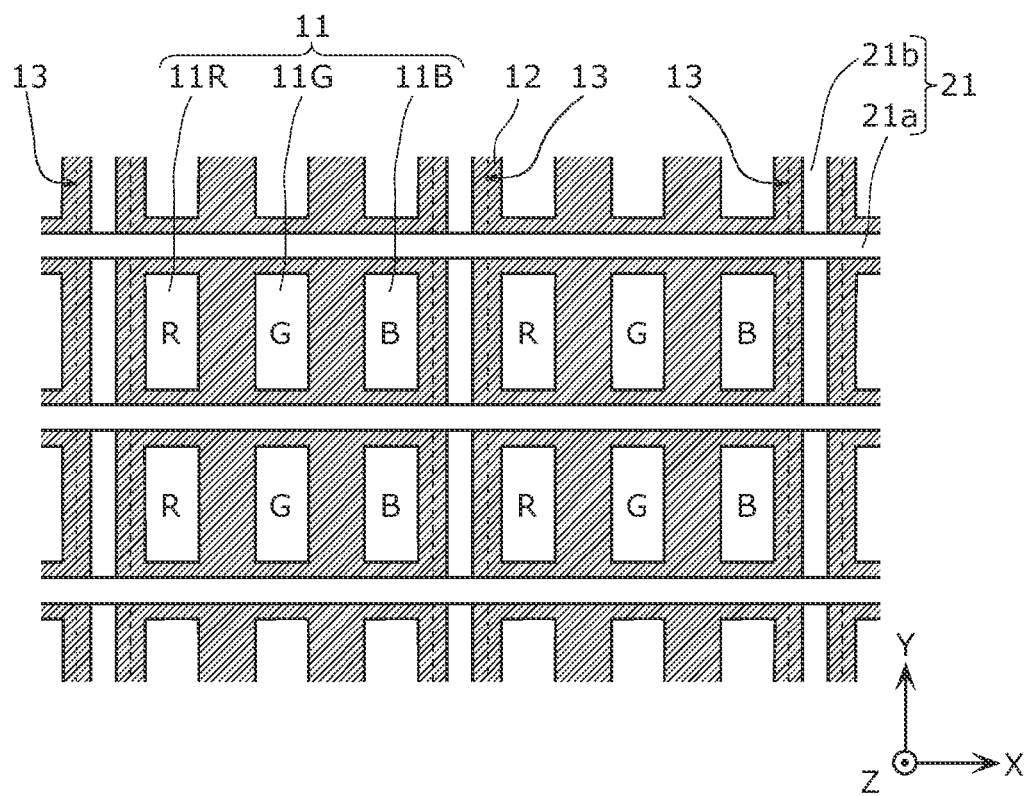
FIG. 4B is a plan view showing a schematic configuration of a display device according to the embodiment of the present invention.

Each of FIG. 4A and FIG. 4B is a plan view showing a schematic configuration of the display device according to the embodiment of the present invention, and is a diagram for illustrating the relative positional relationship between the touch panel and the display panel. FIG. 4A shows a state in which the touch panel having the electrode pattern shown in FIG. 3B is attached on the display panel in First example shown in FIG. 2A. FIG. 4B shows a state in which the touch panel having the electrode pattern shown in FIG. 3B is attached on the display panel in Second example of the present invention shown in FIG. 2B.

As shown in FIG. 4A and FIG. 4B, in the display device 100 of the present embodiment, the metal part of the electrode pattern 21 (the first electrode lines 21a and the second electrode lines 21b) of the touch panel 2 presents within the non-display portion 12 of the display panel 1, when viewing in plan view (when viewing in Z-axis direction). Specifically, the metal part of the electrode pattern 21 (the first electrode lines 21a and the second electrode lines 21b) overlaps the non-display portion 12, and the metal part of the electrode 21 is arranged to be hidden behind the non-display portion 12.

In FIG. 4A, the electrode pattern 21 is arranged to match the pattern of the non-display portion 12, and the electrode pattern 21 is narrower than the non-display portion 12. More specifically, the first electrode lines 21a and the second electrode lines 21b are formed to overlap the lines in both of the row direction and the column direction in the non-display portion 12, and not to extend beyond the non-display portion 12 to the pixel portion 11.

Although the electrode pattern 21 corresponds to all of the row direction patterns and the column direction patterns of the non-display portion 12 in FIG. 4A, the second electrode lines 21b may be thinned every other few lines in the column direction pattern of the non-display portion 12, as shown in FIG. 4B.

Specifically, each of the first electrode lines 21a is arranged between sub-pixels neighboring in the column direction (X-axis direction) of the pixels. In other words, the first electrode lines 21a are arranged for the sub-pixels without being thinned in number. In contrast, each of the second electrode lines 21b is arranged between pixels neighboring in the row direction (Y-axis direction) of the pixels. In other words, the second electrode lines 21a are arranged for the sub-pixels with being thinned.

In this case, as shown in FIG. 4B, it is preferable that the second electrode lines 21b are formed above the auxiliary wires 13. Specifically, it is preferable that the second electrode lines 21b are formed within the non-display portion 12 in which the auxiliary wires 13 are formed. Furthermore, in the case where the auxiliary wires 13 are formed along the X-axis direction, it is preferable that the first electrode lines 21a extending in the X-axis direction are formed above the auxiliary wires 13. Furthermore, in the case where the auxiliary wires 13 are formed along both of the X-axis direction and the Y-axis direction, it is preferable that both of the first electrode lines 21a and the second electrode lines 21b are formed above the auxiliary wires 13.

Although FIG. 4B shows the configuration in which the number of the second electrode lines 21b are thinned, the number of the first electrode lines 21a may be thinned instead. Furthermore, a configuration in which the number of both of the second electrode lines 21b and the first electrode lines 21a is thinned is also possible.

Figure 5:
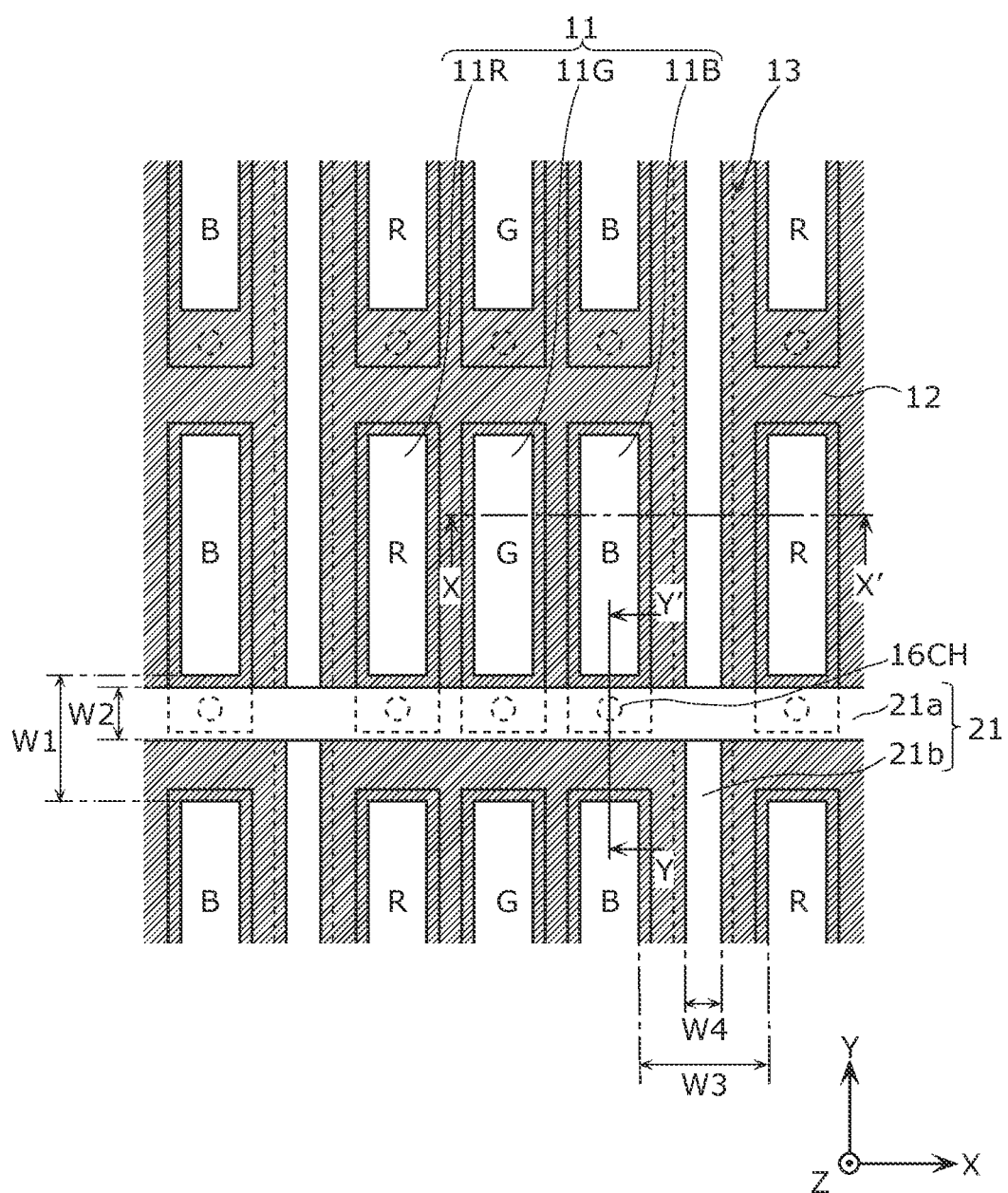
FIG. 5 is a plan view showing a detailed configuration of the display device according to the embodiment of the present invention shown in FIG. 4B.
Figure 6A:
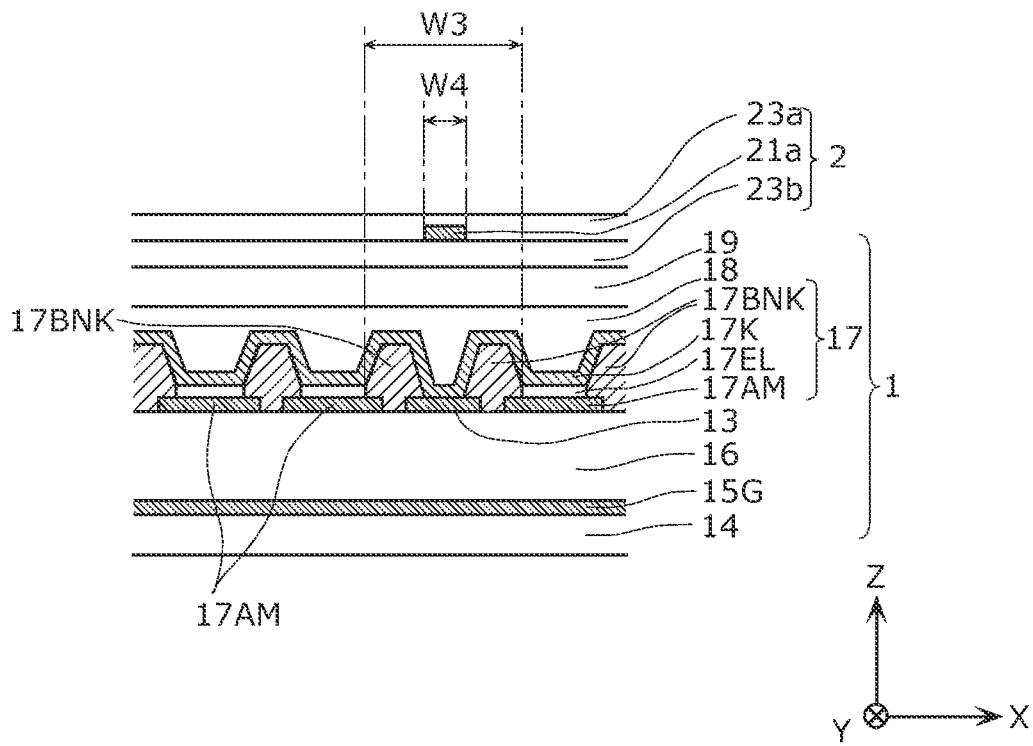
FIG. 6A is a sectional view, at X-X' line in FIG. 5, of the display device according to the embodiment of the present invention.
Figure 6B:
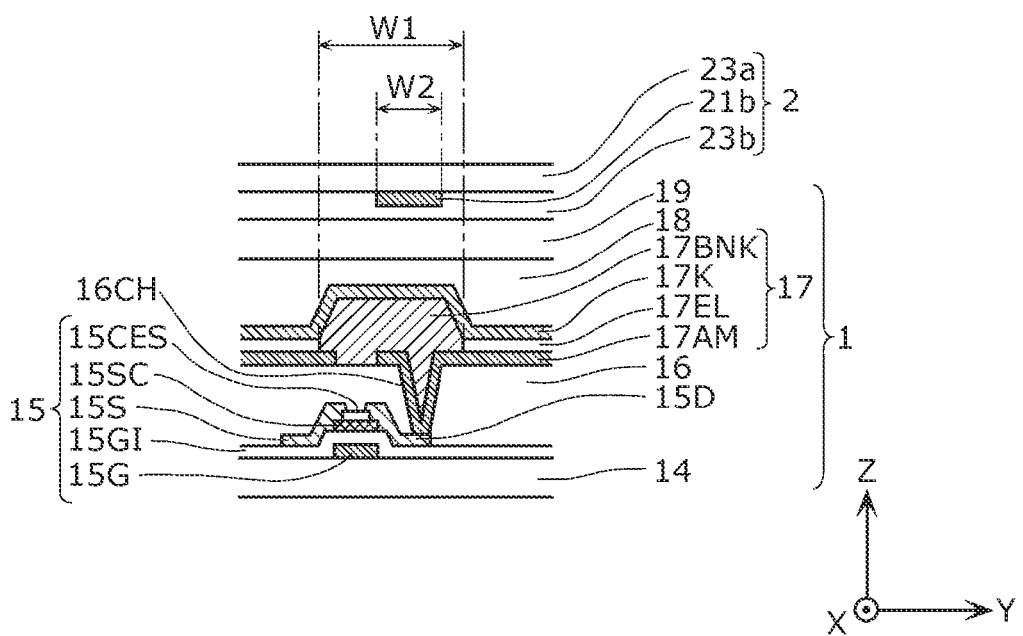
FIG. 6B is a sectional view, at Y-V line in FIG. 5, of the display device according to the embodiment of the present invention.

Next, a detailed configuration of the display device according to the embodiment of the present invention shown in FIG. 4B is described with reference to FIG. 5. FIG. 6A, and FIG. 6B. FIG. 5 shows a plan view of the display device according to the embodiment of the present invention, and shows a relative positional relationship between the display panel and the touch panel. FIG. 6A is a sectional view, at the X-X' line in FIG. 5, of the display device according to the embodiment of the present invention. FIG. 6B is a sectional view, at the Y-Y' line in FIG. 5, of the display device according to the embodiment of the present invention. In the same manner as in the display device shown in FIG. 4B, the display device shown in FIG. 5 uses, as the display panel 1, an organic EL display having the auxiliary wire, and shows an example in which the electrostatic capacitive touch panel is used as the touch panel 2. However, this is not an only example.

As shown in FIG. 5, as described above, the display panel 1 which is an organic EL display includes a display region formed with: a pixel portion (light-emitting region) 11 including a plurality of pixels each including three sub-pixels namely the red pixel 11R, the green pixel 11G, and the blue pixel 11B; and a non-display portion (non-light-emitting region) 12 which is a region excluding the pixel portion 11.

Furthermore, as shown in FIG. 6A and FIG. 6B, the display panel 1 includes an active matrix substrate including: a glass substrate 14; a pixel circuit, which has a thin-film transistor such as a driving transistor 15, formed on the glass substrate 14; and a planarization layer 16 for panelizing the pixel circuit and the like. Furthermore, the display panel 1 includes an organic EL element 17 formed corresponding to each of the sub-pixels. The organic EL element 17 includes: a lower electrode (anode) 17AM formed on the planarization layer 16; an organic light emitting layer 17EL formed on the lower electrode 17AM; and an upper electrode (cathode) 17K formed on the organic light emitting layer 17EL. Furthermore, the display panel 1 includes: a bank 17BNK which defines each of the organic light emitting layers 17EL; a sealing resin layer 18 formed on the upper electrode 17K; and a glass substrate (counter substrate) 19 formed on the sealing resin layer 18. The red pixel 11R, the green pixel 11G, and the blue pixel 11B correspond to the organic light emitting layers 17EL which emit light of the respective colors.

Although the bank 17BNK is a pixel bank, this is not an only example. Furthermore, although the non-display portion 12 is a bank 17BNK in the present embodiment, a black matrix (light-blocking portion) may be used as the non-display portion 12.

Furthermore, as shown in FIG. 5 and FIG. 6A, the auxiliary wire (bus bar) 13, which is electrically connected to the upper electrode 17K, is formed between neighboring pixels. Specifically, the auxiliary wire 13 is placed between a blue pixel 11B (sub-pixel) of a single pixel and a red pixel 11R (sub-pixel) of another pixel, and a plurality of the auxiliary wires 13 is provided to extend in a linear shape along the column direction (Y-axis direction) of the pixels. Here, the auxiliary wire 13 is electrically connected to the upper electrode 17K that is common to all sub-pixels, in order to suppress the voltage drop in the central portion of the display region. In the present embodiment, the auxiliary wire 13 and the upper electrode 17K are connected electrically via an opening in a linear shape formed in the bank 17BNK along the Y-axis direction.

Each of the sub-pixels, namely the red pixel 11R, the green pixel 11G, and the blue pixel 11B has: a driving transistor 15 for driving the sub-pixel; and a selection transistor (not shown) for selecting a sub-pixel for emitting light, from among the plurality of sub-pixels. As shown in FIG. 6B, the driving transistor 15 is a bottom-gate thin-film transistor for example, and includes: a gate electrode 15G formed on the glass substrate 14, a gate insulator 15GI formed on the gate electrode 15G, a semiconductor layer (channel layer) 15SC formed on the gate insulator 15GI, a channel etching stopper layer 15CES formed on the semiconductor layer 15SC, and a pair of source electrode 15S and a drain electrode 15D formed on both ends of the semiconductor layer 15SC. It is to be noted that a silicon semiconductor, an oxide semiconductor, and so on may be used as the semiconductor layer 15SC.

Since the driving transistor 15 in the present embodiment is an n-type TFT, as shown in FIG. 6B, the drain electrode 15D of the driving transistor 15 and the lower electrode 17AM are electrically connected via a contact hole 16CH formed in the planarization layer 16. Although not shown in the Drawings, the source electrode 15S of the driving transistor 15 is connected to the power line (not shown). In the case where the driving transistor 15 is of p-type, the source electrode 15S of the driving transistor 15 is connected to the lower electrode 17AM via the contact hole 16CH.

As shown in FIG. 6A and FIG. 6B, the touch panel 2 includes: a first substrate 23a on which the first electrode lines 21a are formed along the row direction (X-axis direction) of the pixels; and a second substrate 23b on which the second electrode lines 21b are formed along the column direction (Y-axis direction) of the pixels, attached to each other via the insulation layer (not shown). The first electrode line 21a and the second electrode line 21b are thin metal wires in a linear shape consisting of a metal, and the line width is constant. Furthermore, although not shown in the Drawings, since the first electrode lines 21a and the second electrode lines 21b are formed throughout the detection region (detection surface) in a horizontal rectangular shape in the present embodiment, the first electrode line 21a is longer than the second electrode line 21b.

As shown in FIG. 5, in plan view, the second electrode line (metal wire) 21b on the touch panel 2 is aligned to overlap the auxiliary wire 13 of the display panel 1, and is not arranged between the sub-pixels. Furthermore, in plan view, the first electrode line (metal wire) 21a on the touch panel 2 is aligned on the contact hole 16CH provided corresponding to each sub-pixel. Specifically, the first electrode line 21a is arranged to overlap the contact holes 16CH. Although the second electrode line 21b is narrower than the auxiliary wire 13 in the present embodiment, the second electrode line 21b may be wider than the auxiliary wire 13.

Furthermore, as shown in FIG. 6A and FIG. 6B, it is preferable that a relationship which is W1-W2≤W3−W4 is satisfied where W1 represents the width between sub-pixels neighboring in the X-axis direction in the non-display portion (non-light-emitting region) 12, W2 represents the width (line width) of the first electrode line 21a, W3 represents the width between the sub-pixels neighboring in the Y-axis direction in the non-display portion (non-light-emitting region) 12, and W4 represents the width (line width) of the second electrode line 21b. In the present embodiment, the width W1 is set to the width between the pixels since the auxiliary wire 13 is arranged between the pixels.

Hereinafter, description is provided on the reasons why it is preferable to adopt the above-described configuration for the display device according to the present embodiment.

First, description is provided on the reasons why it is preferable in the present embodiment to provide the second electrode lines 21b only on the auxiliary wires 13.

The second electrode line 21b may be arranged not only between pixels but also between sub-pixels in a pixel. However, since the width (interval) of the non-display portion 12 between sub-pixels in the pixel is smaller than that between the pixels, it is required to make the second electrode line 21*b* narrower in order to arrange the second electrode line 21*b* not to protrude toward the pixel portion (light-emitting region) 11. Therefore, a wide second electrode line (metal wire) 21*b* is arranged between pixels where the auxiliary wire 13 is formed, and a narrow second electrode line (metal wire) 21*b* is arranged between the sub-pixels in a pixel.

Here, in the electrostatic capacitance touch panel 2, the sensitivity in detection by the first electrode line 21*a* and the second electrode line 21*b* improves as a time constant expressed by the product of the wire resistance and the wire capacitance is smaller.

Therefore, arranging the wide second electrode line (metal wire) 21*b* between pixels where the auxiliary wire 13 is formed and arranging the narrow second electrode line (metal wire) 21*b* between the sub-pixels in a pixel as described above significantly reduces the detection sensitivity of the second electrode line 21*b* formed between the sub-pixels in a single pixel, as compared with the second electrode line 21*b* formed between the pixels. Specifically, in this case, the narrow second electrode line 21*b* formed between the sub-pixels in the pixel is not used when performing position detection and has no meaning.

Based on the above reasons, it is preferable that the second electrode line 21*b* of the touch panel 2 is arranged only on the auxiliary wire 13. With this, the second electrode line 21*b* formed can be utilized for position detection efficiently, without being wasted.

Next, description is provided on the reasons why it is preferable to arrange the first electrode lines 21*a* on the contact holes 16CH.

In order to equalize the detection sensitivity in the X-axis direction and the detection sensitivity in the Y-axis direction in the touch panel 2, it is sufficient to equalize the wire resistance of the first electrode lines 21*a* formed along the X-axis direction and the wire resistance of the second electrode lines 21*b* formed along the Y-axis direction. Specifically, it is sufficient to set the width (wire width) of the first electrode line 21*a* and the width (wire width) of the second electrode line 21*b* to a desirable value according to the length (wire length) of the first electrode line 21*a* and the length (wire length) of the second electrode line 21*b*, to equalize the wire resistance. Specifically, regarding a relationship between the width of the first electrode line 21*a* (W2) and the width of the second electrode line 21*b* (W4), it is possible to equalize the detection sensitivity in the X-axis direction and the Y-axis direction by increasing the width of the longer electrode line.

Specifically, it is sufficient to satisfy a relationship which is W2>W4 in the case of L1>L2, and a relationship which is W2<W4 in the case of L1<L2, where L1 represents the length of the first electrode line 21*a* and L2 represents the length of the second electrode line 21*b*.

By forming the first electrode line 21*a* and the second electrode line 21*b* to satisfy these relationships, even when the first electrode line 21*a* and the second electrode line 21*b* have different lengths, it is possible to reduce the difference in wire resistance between the first electrode line 21*a* and the second electrode line 21*b*. This allows reducing the difference between the detection sensitivity in the X-axis direction and the detection sensitivity in the Y-axis direction, in the touch panel 2.

For example, in the case where the detection surface (detection region) of the touch panel 2 is in a horizontal rectangle, and when assuming that the electrode-line extraction structure is the one-side extraction structure in both of the X-axis direction and Y-axis direction, the first electrode line 21*a* extending in the long-side direction (X-axis direction) is longer than the second electrode line 21*b* extending in the short-side direction (Y-axis direction) (L1>L2). In this case, it is sufficient to set the width (W2) of the first electrode line 21*a* greater than the width (W4) of the second electrode line 21*b* (W2>W4), to equalize the wire resistance of the first electrode line 21*a* and the wire resistance of the second electrode line 21*b*.

Here, the contact hole 16CH provided corresponding to each sub-pixel is formed under the bank 17BNK which is the non-display portion (non-light-emitting region) 12. Accordingly, by arranging the first electrode line 21*a* to overlap the contact hole 16CH, the line width of the first electrode line 21*a* can be increased with ease.

Based on the above reason, it is preferable to arrange the first electrode lines 21*a* on the contact holes 16CH. Specifically, by arranging the first electrode lines 21*a* to overlap the contact holes 16CH, it becomes possible to increase the line width of the first electrode line 21*a* easily even when the first electrode line 21*a* is longer than the second electrode line 21*b*. This allows reducing the difference (sensitivity difference) between the detection sensitivity of the first electrode line 21*a* and the detection sensitivity of the second electrode line 21*b*.

It is to be noted that, when the touch panel 2 is enlarged, the wire length of the electrode line is increased and the resistance increases. Therefore, adoption of a both-side extraction structure as the electrode-line extraction structure to shorten each electrode line is an option for lowering the wire resistance of the electrode lines. For example, in the case where the detection surface (detection region) of the touch panel 2 is in a horizontal rectangle, extracting the electrode line from both short sides in the right and left of the detection surface can be considered. In this case, it is possible to make the length of the first electrode line 21*a* extending in the long-side direction (X-axis direction) approximately half the length of that in the case of one-side extraction structure. Even in such a case, it is desirable to compare the wire length of the first electrode line 21*a* and the wire length of the second electrode line 21*b*, and make the longer electrode line wider. For example, in the case where the second electrode line 21*b* extending in the short-side direction (Y-axis direction) has become longer than the first electrode line 21*a* extending in the long-side direction (X-axis direction) (L2>L1) as a result of adopting the both-side extraction structure, it is sufficient to make the width (W4) of the second electrode line 21*b* greater than the width (W2) of the first electrode line 21*a* (W4>W2), to equalize the wire resistances of the first electrode line 21*a* and the second electrode line 21*b*.

Figure 7:
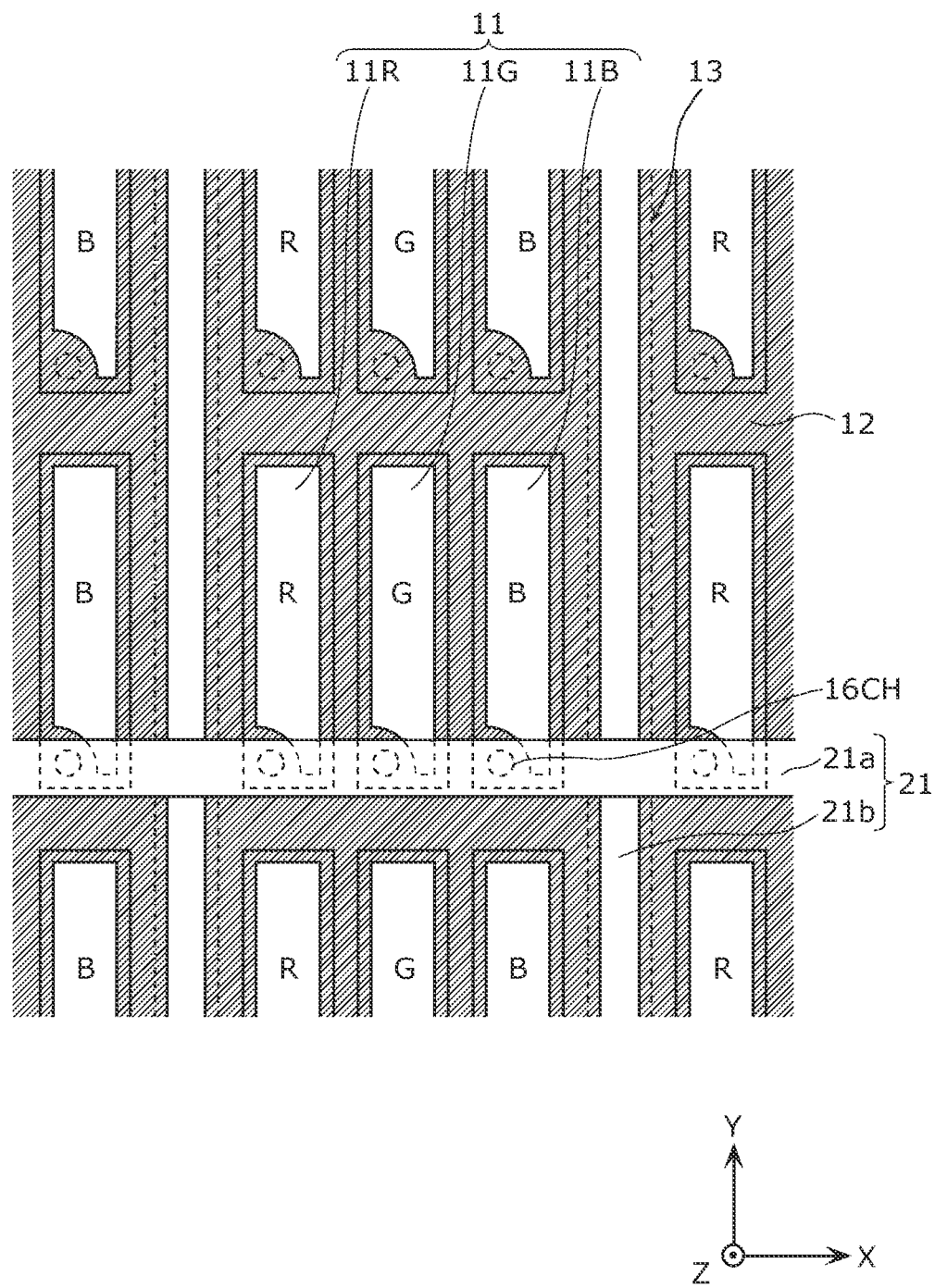
FIG. 7 shows a plan view of a display device according to another embodiment of the present invention.

Furthermore, the position of the contact hole 16CH in the display panel 1 is not limited to the position shown in FIG. 5, and may be at the position shown in FIG. 7. As shown in FIG. 7, by shifting the contact hole 16CH to a corner of the sub-pixel, it is possible to increase the area of the region (light-emitting region) of the red pixel 11R, the green pixel 11G, and the blue pixel 11B.

Next, description is provided on a reason why it is preferable to satisfy the relational expression which is W1-W2≤W3-W4 among: the width (W1) between sub-pixels neighboring in the X-axis direction; the line width (W2) of the first electrode line 21*a*; the width (W3) between sub-pixels neighboring in the Y-axis direction; and the line width (W4) of the second electrode line 21*b*.

For example, in the case where the position of the second electrode line 21*b* in FIG. 5 is shifted horizontally and protrudes toward the pixel portion 11 due to the misalignment between the display panel 1 and the touch panel 2 or the like, monochromatic light of any one of the red pixel 11R, green pixel 11G, and the blue pixel 11B is blocked by the second electrode line 21b. Therefore, the luminance balance of the RGB (white balance) is lost, and image quality is degraded significantly.

On the other hand, in the case where the position of the first electrode line 21a in FIG. 5 is shifted vertically due to the misalignment in the same manner, the light of all of the red pixel 11R, green pixel 11G, and blue pixel 11B are equally blocked. Therefore, the luminance is lowered but the luminance balance (white balance) is not lost so much, and degradation in image quality is minor.

Here, the margin of the shift in position of the first electrode line 21a in the X-axis direction is represented as a difference (W1−W2) between the width (W1) between the sub-pixels neighboring in the X-axis direction and the width (W2) of the first electrode line 21a. Furthermore, the margin of the shift in position of the second electrode line 21b in the Y-axis direction is represented as a difference (W3−W4) between the width (W3) between the sub-pixels neighboring in the Y-axis direction and the width (W4) of the second electrode line 21b. Therefore, taking into consideration the impact of the misalignment on the image quality, it is preferable that: the margin of the shift in position in the X-axis direction is smaller than the margin of the shift in position in the Y-axis direction; and W1−W2≤W3−W4 is satisfied.

By satisfying this relational expression, even when the misalignment between the display panel 1 and the touch panel 2 occurs, it is possible to suppress the loss in the luminance balance, With this, it is possible to suppress degradation of image visibility.

As described above, with the display device 100 according to the present embodiment, the display panel 1 and the touch panel 2 are attached to each other to align positions of the metal part of the electrode patterns 21 of the touch panel 2 within the line width of the non-display portion of the display panel 1 of the display panel 1.

Specifically, in the present embodiment, a metal material having an excellent conductivity and low resistance is used as the material of the electrode patterns 21 (the first electrode lines 21a and second electrode lines 21b) of the touch panel 2, that is, the metal wire is used for the first electrode lines 21a and second electrode lines 21b, without taking the light transparency into consideration. Thus, it is possible to reduce the wire resistance of the first electrode lines 21 and the second electrode lines 21b as compared with the case in which the first electrode lines 21a and the second electrode line 21b comprise only the transparent electrode material. Therefore, the touch panel 2 can be increased in screen size and support higher definition with ease.

In addition, it possible to suppress blocking of the light of the image on the display panel 1 caused by the first electrode line 21a and the second electrode line 21b, by further forming the first electrode line 21a and the second electrode line 21b to overlap the non-display portion 12 within the non-display portion 12 of the display panel 1. Specifically, the line width (W2) of the first electrode line 21a is smaller than the width of the non-display portion 12 in the Y-axis direction, and the line width (W4) of the second electrode line 21b is smaller than the width of the non-display portion 12 in the X-axis direction. With this, it is possible to suppress degradation of image visibility.

Furthermore, by using the metal wire for the first electrode line 21a and the second electrode line 21b, even when the touch panel 2 is bent, it is possible to prevent the first electrode line 21a and the second electrode line 21b from breaking or peeling from the first substrate 23a and the second substrate 23b. With this, the reliability against bending stress can be improved.

As described above, with the display device 100 according to the present embodiment, it is possible to ensure the conductivity of the electrode pattern 21 of the touch panel 2 without affecting the visibility of the image display of the display panel 1. Thus, it is possible to realize a display device with a touch panel, which is relatively larger in inch size and provides excellent visibility and high definition.

For example, adoption of a low-resistance metal such as Ag for the electrode pattern 21 (the first electrode lines 21a and second electrode lines 21b) makes it possible to realize a touch panel capable of detecting the coordinate position with higher accuracy even when the electrode pattern 21 is formed in the non-display portion 12 which has a line width of several tens of μm order. Furthermore, although the electrode pattern 21 comprising a metal such as Ag is opaque and has a light-blocking property, the electrode pattern 21 (the first electrode lines 21a and second electrode lines 21b) is formed to be hidden in the non-display portion 12 of the display panel 1, whereby visibility of the image display of the display panel 1 is not reduced. As a result, it is possible to realize a display device with a touch panel capable of supporting the larger screen and higher definition.

Furthermore, in the present embodiment, the electrode pattern 21 of the touch panel 2 may be thinned every other few lines, as shown in FIG. 4B. Since the touch panels for use in the current icon touch input is not required to support definition as high as that of the display panel, the accuracy level in the finger coordinate position detection can be maintained with the above-described configuration in which the number of the electrode patterns 21 are thinned. Therefore, by adopting the configuration in which the number of the electrode patterns 21 is thinned, it becomes possible to reduce the capacitance detection IC corresponding to each electrode line of the electrode pattern 21, thereby providing an advantageous effect including reduction in costs and weight.

In the present embodiment, from a view-point of the conductivity, it is desirable that the electrode pattern 21 of the touch panel 2 is made wider as much as possible, on condition that the electrode pattern 21 does not extend beyond the line width of the non-display portion 12 of the display panel 1, with taking into consideration the accuracy in the shape, position, attachment of the touch panel 2 and the display panel 1, and so on, during forming. With this, it is possible to further lower the resistance of the electrode pattern 21, thereby further improving the accuracy in the finger coordinate position detection. It is to be noted that, in a touch panel which supports a display panel of approximately 20 inches which has the non-display portion 12 having the line width of several tens of μm order, the coordinate position of the finger can be detected with high accuracy even when the line width of the electrode pattern 21 is approximately 5 μm to 7 μm.

Figure 8:
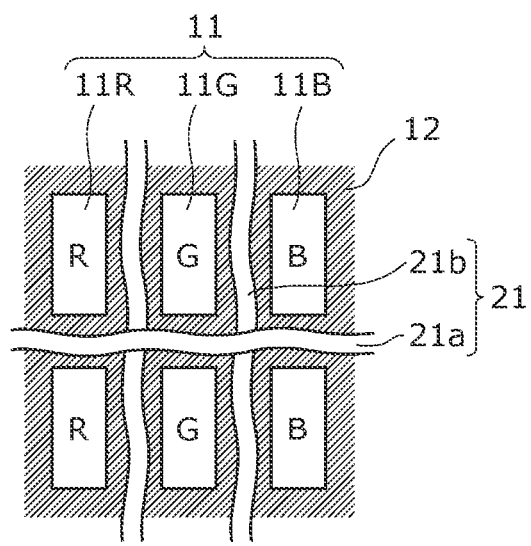
FIG. 8 is a plan view showing a configuration of electrode patterns in First modification of the touch panel of the display device according to the embodiment of the present invention.

Although both of the first electrode line 21a and the second electrode line 21b in the present embodiment are in the straight (linear) shape and form the electrode pattern 21 in the mesh pattern (grid pattern) in plan view as shown in FIG. 3B, the electrode pattern in the shape shown in FIG. 8 may be adopted. FIG. 8 is a plan view showing a configuration of electrode patterns in First modification of the touch panel in the display device according to the embodiment of the present invention.

As shown in FIG. 8, the first electrode lines 21a and the second electrode lines 21b in the present modification are formed in a wave-like shape or meandering shape in plan view, and the electrode pattern 21 is a wave-like pattern. It is to be noted that, even in this case, the electrode pattern 21 is formed within the non-display portion 12 to make the electrode pattern 21 not to extend beyond the pixel portion 11 from the non-display portion 12.

As described above, by forming the electrode patterns 21 in a wave-like shape or meandering shape in plan view, it becomes possible to increase the capacitance which occurs when touched by a finger even in the case where the line width of the electrode pattern cannot be increased for the purpose of obtaining higher definition, thereby improving the sensitivity in detection of the capacitance change. Furthermore, adopting the meandering or wave-like shape for the electrode patterns 21 in plan view allows preventing the electrode pattern 21 from breaking or peeling when the display device (touch panel) is bent, thereby providing an advantageous effect such as an improvement in the mechanical strength of the electrode patterns 21.

Although both of the first electrode line 21a and the second electrode line 21b have the wave-like shapes in the present modification, only one of the first electrode line 21a and the second electrode line 21b may have the wave-like shape.

Figure 9A:
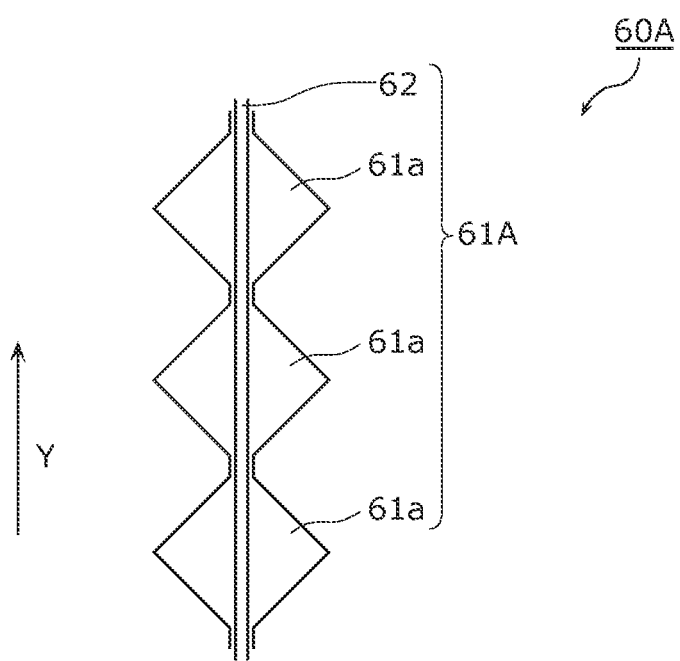
FIG. 9A is a plan view showing a configuration of electrode patterns in Y-axis direction in Second modification of the touch panel of the display device according to the embodiment of the present invention.
Figure 9B:
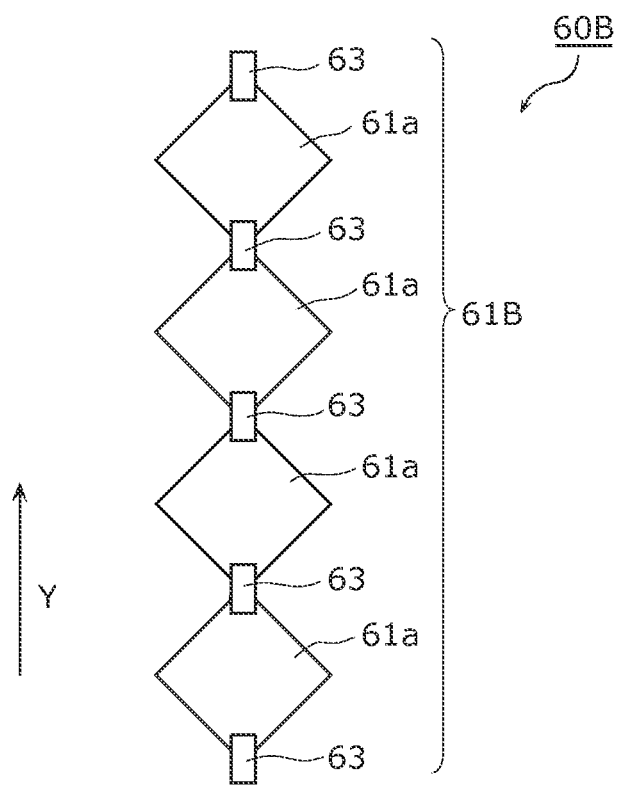
FIG. 9B is a plan view showing a configuration of electrode patterns in Y-axis direction in Third modification of the touch panel of the display device according to the embodiment of the present invention.

Furthermore, an example of the shape of the electrode pattern 21 in the present embodiment may include patterns shown in FIG. 9A and FIG. 9B. FIG. 9A and FIG. 9B are plan views showing configurations of electrode patterns (in Y-axis direction) in Second modification and Third modification, respectively, of the touch panel in the display device according to the embodiment of the present invention.

As shown in FIG. 9A, in Second modification, a single second electrode pattern 61A extending in the Y-axis direction of the electrode pattern 60A includes: transparent electrode patterns (electrode pads) 61a, each in a rectangular shape that forms a diamond, having corners connected with each other and arranged in the Y-axis direction; and a metal line 62 layered on the transparent electrode pattern 61a to pass through the center of the transparent electrode pattern 61a. The metal line 62 is the metal part in the second electrode pattern 61A, and is a low-resistance narrow metal line.

As shown in FIG. 9B, a single second electrode pattern 61B extending in the Y-axis direction of the electrode pattern 60B in Third modification includes: transparent electrode patterns (electrode pads) 61a, each in a rectangular shape that forms a diamond, having corners connected with each other and arranged in the Y-axis direction; and a metal line 63 connecting the corners of the transparent electrode patterns 61a. The metal line 62 is the metal part of the second electrode pattern 61B, and is a low-resistance narrow metal line provided at a connecting portion between the transparent electrode patterns 61a.

In FIG. 9A and FIG. 9B, in the same manner as the electrode pattern 21 shown in FIG. 4A or FIG. 4B, the metal lines 62 and 63 are formed to overlap the non-display portion 12 within the line width of the non-display portion 12 of the display panel 1.

A material of the metal lines 62 and 63 may be selected from at least one kind of metal out of: copper (Cu), nickel (Ni), aluminum (Al), silver (Ag), and chromium (Cr); and an alloy containing the selected metal. As a material of the transparent electrode pattern 61a, a transparent conductive metal oxide such as ITO or indium zinc oxide (IZO) may be used.

Although a single second electrode pattern extending in the Y-axis direction has been described in FIG. 9A and FIG. 9B, practically, a plurality of the second electrode patterns are arranged in parallel to form the electrode pattern of the touch panel. Furthermore, although the second electrode pattern extending in the Y-axis direction has been described in FIG. 9A and FIG. 9B, the first electrode pattern extending in the X-axis direction may also have the same configuration. In this case, the transparent electrode patterns 61a are formed throughout the touch surface, to prevent the transparent electrode patterns 61a of the electrode pattern in the X-axis direction and the Y-axis direction from overlapping each other.

As described above, with the electrode patterns 60A and 60B according to the modification shown in FIG. 9A and FIG. 9B, since the metal lines 62 and 63 are formed within the non-display portion 12 of the display panel 1, the resistance of the electrode line can be lowered without deteriorating the visibility of the image display of the display panel 1, in the same manner as the electrode pattern 21 shown in FIG. 4A and FIG. 4B. With this, it is possible to realize a display device with a touch panel capable of supporting the increase in the screen size and definition.

Furthermore, since the electrode patterns 60A and 60B in the modification shown in FIG. 9A and FIG. 9B have transparent electrode patterns 61a having a large area, it is possible to improve the sensitivity in the detection of capacitance change.

It is to be noted that providing the metal wire 62 as a continuous line passing through inside of the transparent electrode patterns 61a as shown in FIG. 9A provides an electrode pattern having excellent conductivity and further lower resistance, as compared with the case in which the metal line 63 is arranged as a partial line provided only at connecting portions between the transparent electrode patterns 61a. It is to be noted that whether to adopt the electrode pattern 60A shown in FIG. 9A or the electrode pattern 60B shown in FIG. 9B may be selected depending on the performance required for the display device, as appropriate.

Furthermore, as in the present embodiment, the display panel 1 has a rectangle plan view shape instead of a square plan view shape, in many cases. In this case, in the electrode pattern 21 of the touch panel 2, the plurality of first electrode lines 21a extending in the X-axis direction and the plurality of second electrode lines 21b extending in the Y-axis direction have different lengths. Therefore, it is preferable to make the longer electrode line wider than the shorter electrode line for example, to make the wire resistance (electrical resistance value) of each of the electrode lines in the X-axis direction and Y-axis direction match substantially as described above, even when the first electrode lines 21a and the second electrode lines 21b are different in lengths.

Furthermore, although the second electrode line 21b is formed above the auxiliary wire 13 as shown in FIG. 4B, the second electrode line 21b may be formed above another wire formed at a position overlapping the non-display portion 12. For example, the second electrode line 21b (or the first electrode line 21a) may be formed at a position overlapping the bank and above the power line for supplying power to the thin-film transistor (driving transistor) which drives the organic EL element.

Furthermore, although the bank 17BNK in the display panel 1 is used as the non-display portion 12 to overlap the first electrode line 21a and the second electrode line 21b in the present embodiment, the black matrix in the display panel 1 may be used as the non-display portion 12, With this, the first electrode line 21a and the second electrode line 21b which are metal wires are covered with the black matrix, thereby suppressing the degradation in the visibility of the image on the display panel 1 caused by the first electrode line 21a and the second electrode line 21b.

Next, description is provided on the display device according to the embodiment and a display device according to a comparison example of the present invention.

In the present embodiment, in the display panel 1 and the touch panel 2 of 20-inch, the electrode pattern 21 comprising Ag is provided at a position overlapping the black matrix (BM) which is the non-display portion 12. In the comparison example, in a display panel and a touch panel of 20-inch, an electrode pattern comprising ITO is provided at a position overlapping a black matrix (BM) which is a non-display portion. The touch panel used here has a substrate (first substrate and second substrate) which is 270 mm in the vertical direction, and 460 mm in the horizontal direction. The present embodiment and the comparison example are different only in the electrode patterns. The electrode pattern 21 comprising Ag in the present embodiment has the thickness of approximately 5 μm and the line width of 5 μm in a straight shape, while the electrode pattern 21 comprising ITO in the comparison example has the thickness of 100 μm and the line width of 30 μm in a straight shape.

The result of measurement on the sensitivity in the position detection of the touch panel in the present embodiment and the comparison example configured as above shows: sufficient sensitivity for practical use has been obtained with the present embodiment in which the electrode pattern comprising Ag is used; the sufficient sensitivity has not been obtained with the comparison example, in which the electrode pattern comprising ITO is used, regardless of the increased film thickness and width.

A possible factor of the above difference in the sensitivity is the difference in the electrical conductivity between Ag and ITO used as the material of the electrode patterns. In this case, it is possible to further increase the film thickness of the ITO electrode to lower the resistance, however, this may cause a peeling problem during forming of the ITO film. Furthermore, increasing the film thickness of the ITO electrode pattern causes problems such as: increase in the occurrence of the peeling of the electrode pattern in the case where the display device is used as a flexible display; occurrence of cracks in the electrode pattern in the case where the display panel is bent. Therefore, it is impossible to simply increase the film thickness as a way to lower the resistance of the ITO electrode pattern. On the other hand, since the electrode pattern comprising Ag has lower resistivity and excellent conductivity, a low resistance wire can be easily realized without increasing the film thickness.

Furthermore, as another embodiment, the shape of the electrode pattern comprising Ag in the present embodiment above may be formed in a meandering shape, instead of the straight shape. It has been confirmed that adopting the above-described aspect further improves the sensitivity in the position detection of the touch panel. It is considered that this is due to the advantageous effect brought by the increase in the contact area with the finger.

The display device according to the present invention has been described based on the embodiments and modifications, however, the present invention is not intended to be limited to the embodiments and modifications described above. For example, optionally components and functions in the modification and the embodiments without departing form and obtained by all such modifications that occur to those skilled in the art for the modification and the embodiments, the spirit of the present invention form is realized by combining also included in the present invention. It is to be noted that the present invention can be applied not only as a display device, but also as a touch panel attached to the display device.

INDUSTRIAL APPLICABILITY

The present invention can be widely utilized in various electronic apparatuses having touch panels, and is useful for touch panels used for operating electronic apparatuses, display devices having the touch panels, and the like.

REFERENCE SIGNS LIST

1 Display panel
2 Touch panel
11 Pixel portion
11R Red pixel (sub-pixel)
11G Green pixel (sub-pixel)
11B Blue pixel (sub-pixel)
12 Non-display portion
13 Auxiliary wire
14, 19 Glass substrate
15 Driving transistor
15G Gate electrode
15GI Gate insulator
15SC Semiconductor layer
15CES Channel etching stopper layer
15S Source electrode
15D Drain electrode
16 Planarization layer
16CK Contact hole
17 Organic EL element
17AM Lower electrode
17EL Organic light-emitting layer
17K Upper electrode
17BNK Bank
18 Sealing resin layer
21, 60A, 60B Electrode pattern
21a First electrode line
21b Second electrode line
22 Insulation layer
23a First substrate
23b Second substrate
61A, 61B Second electrode pattern
61a Transparent electrode pattern
62, 63 Metal line
100 Display device

The invention claimed is:
1. A display device comprising:
a display panel including a plurality of pixels arranged in rows and columns; and
a touch panel opposed to the display panel,
wherein the display panel includes a non-display portion which is a region between neighboring pixels,
the touch panel includes: a plurality of first electrode patterns which are formed along a first direction which is one of a row direction of the pixels and a column direction of the pixels; and a plurality of second electrode patterns which are formed along a second direction which is the other one of the row direction of the pixels and the column direction of the pixels, at least a part of the first electrode patterns and at least a part of the second electrode patterns being metal,
the metal part of the first electrode patterns and the metal part of the second electrode patterns are present within the non-display portion of the display panel in plan view,
each of the pixels includes a plurality of sub-pixels which are arranged along the first direction and have different colors,
each of the sub-pixels includes: an upper electrode, a lower electrode, and an organic light-emitting layer formed between the upper electrode and the lower electrode and corresponding to the pixel,
the display panel includes: a bank which defines the organic light-emitting layer and is formed correspond- ing to the non-display portion; and an auxiliary wire covered with the bank and electrically connected to the upper electrode, and at least one of (i) the first electrode patterns and (ii) the second electrode patterns is arranged above the auxiliary wire.

2. The display device according to claim 1, wherein each of the first electrode patterns is arranged between the sub-pixels neighboring in the second direction, and the auxiliary wire and each of the second electrode patterns are arranged between the pixels neighboring in the first direction.

3. The display device according to claim 2, wherein a width between the pixels neighboring in the first direction is greater than a width between the sub-pixels neighboring in the first direction.

4. The display device according to claim 2, wherein each of the sub-pixels includes a transistor for driving the sub-pixel, and the first electrode patterns are each arranged to overlap a contact hole for connecting the lower electrode with a source electrode or a drain electrode of the transistor, in plan view.

5. The display device according to claim 2, wherein each of the first electrode patterns is a first electrode line which is in a linear shape and has a constant line width, each of the second electrode patterns is a second electrode line which is in a linear shape and has a constant line width, and a relationship which is W1−W2<W3−W4 is satisfied where W1 represents a width between the sub-pixels neighboring in the second direction, W2 represents a width of the first electrode line, W3 represents a width between the pixels neighboring in the first direction, and W4 represents a width of the second electrode line.

6. The display device according to claim 5, wherein, where L1 represents a length of the first electrode line, and L2 represents a length of the second electrode line, a relationship which is W2>W4 is satisfied when L1>L2, and a relationship which is W2<W4 is satisfied when L1<L2.

7. The display device according to claim 1, wherein at least one of the first electrode patterns and the second electrode patterns has a wave-like plan view shape.

8. The display device according to claim 7, wherein both of the first electrode patterns and the second electrode patterns have wave-like plan view shapes.

9. The display device according to claim 1, wherein at least one of the first electrode patterns and the second electrode patterns includes: a plurality of transparent electrode patterns each in a rectangular shape and having corners connected with each other; and a metal line, which is the metal part, layered on the transparent electrode patterns, and the transparent electrode patterns are formed to extend beyond the metal line.

10. The display device according to claim 1, wherein at least one of the first electrode patterns and the second electrode patterns includes: a plurality of transparent electrode patterns each in a rectangular shape; and a metal line, which is the metal part, for connecting corners of the transparent electrode patterns with each other.

11. The display device according to claim 1, wherein the display panel includes a light-blocking portion, and the non-display portion is the light-blocking portion.

12. The display device according to claim 1, wherein each of the first electrode patterns is a first electrode line which is in a linear shape and has a constant line width, each of the second electrode patterns is a second electrode line which is in a linear shape and has a constant line width, a line width of the first electrode line is smaller than a width of the non-display portion in the second direction, and a line width of the second electrode line is smaller than a width of the non-display portion in the first direction.

* * * * *